United States Patent
Yamaguchi et al.

(10) Patent No.: US 7,442,958 B2
(45) Date of Patent: Oct. 28, 2008

(54) THIN FILM SEMICONDUCTOR DEVICE

(75) Inventors: Shinya Yamaguchi, Mitaka (JP); Mutsuko Hatano, Kokubunji (JP); Mitsuharu Tai, Kokubunji (JP); Sedng-Kee Park, Higashimurayama (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 32 days.

(21) Appl. No.: 11/768,588

(22) Filed: Jun. 26, 2007

(65) Prior Publication Data

US 2007/0246709 A1    Oct. 25, 2007

Related U.S. Application Data

(60) Continuation of application No. 11/186,907, filed on Jul. 22, 2005, now Pat. No. 7,256,423, which is a division of application No. 10/438,843, filed on May 16, 2003, now Pat. No. 6,969,871.

(30) Foreign Application Priority Data

May 17, 2002    (JP)    ............................ P2002-142368

(51) Int. Cl.
    *H01L 29/76* (2006.01)
(52) U.S. Cl. ........................... 257/64; 257/66; 257/349; 257/E29.003
(58) Field of Classification Search .................... 257/64, 257/65, 66, 72, 349, E29.003, E29.117
    See application file for complete search history.

(56) References Cited

U.S. PATENT DOCUMENTS

| | | | |
|---|---|---|---|
| 5,248,630 A | 9/1993 | Serikawa et al. | |
| 6,501,095 B2 | 12/2002 | Yamaguchi et al. | |
| 6,670,638 B2 | 12/2003 | Tamura et al. | |
| 6,737,672 B2 | 5/2004 | Hara et al. | |
| 2001/0001745 A1 | 5/2001 | Im et al. | |
| 2002/0006701 A1 | 1/2002 | Yamamoto | |
| 2002/0031876 A1 | 3/2002 | Hara et al. | |
| 2002/0100909 A1 | 8/2002 | Yamaguchi et al. | |
| 2002/0102823 A1 | 8/2002 | Yamaguchi et al. | |
| 2003/0181043 A1 | 9/2003 | Tanada et al. | |

(Continued)

FOREIGN PATENT DOCUMENTS

JP    A-10-41234    2/1989

(Continued)

OTHER PUBLICATIONS

S.M. Sze, "Physics of Semiconductor Devices," Second Edition, 1981, W. Wiley & Songs, New York, NY, USA.

*Primary Examiner*—Minh-Loan T Tran
(74) *Attorney, Agent, or Firm*—Antonelli, Terry, Stout & Kraus, LLP.

(57) ABSTRACT

A thin film semiconductor device is provided which includes an insulating substrate, a Si thin film formed over the insulating substrate, and a transistor with the Si thin film as a channel thereof. The Si thin film includes a polycrystal where a plurality of narrow, rectangular crystal grains are arranged. A surface of the polycrystal is flat at grain boundaries thereof. Also, an average film thickness of the boundaries of crystals of the Si thin film ranges from 90 to 100% of an intra-grain average film thickness.

4 Claims, 11 Drawing Sheets

U.S. PATENT DOCUMENTS

| | | |
|---|---|---|
| 2003/0183875 A1 | 10/2003 | Isobe et al. |
| 2003/0230749 A1 | 12/2003 | Isobe et al. |
| 2003/0230750 A1 | 12/2003 | Koyama et al. |

FOREIGN PATENT DOCUMENTS

| | | |
|---|---|---|
| JP | 7-321339 | 12/1995 |
| JP | A-7-321339 | 12/1995 |
| JP | A-08-55808 | 2/1996 |
| JP | 2000-133807 | 5/2000 |
| JP | 2001-102304 | 4/2001 |
| JP | 2002-124467 | 4/2002 |
| TW | 363726 | 7/1999 |
| TW | 429629 | 4/2001 |
| TW | 478171 | 3/2002 |
| TW | 480730 | 3/2002 |

THIN FILM SEMICONDUCTOR DEVICE

CROSS-REFERENCE TO RELATED APPLICATIONS

This Application is a continuation of U.S. application Ser. No. 11/186,907, filed Jul. 22, 2005, now U.S. Pat. No. 7,256,423, which in turn, is a Divisional of U.S. application Ser. No. 10/438,843 (now U.S. Pat. No. 6,969,871), filed May 16, 2003; the entire disclosures of which are hereby incorporated by reference.

BACKGROUND OF THE INVENTION

1. Field of the Invention

The present invention relates to a thin film semiconductor device used for an image display device or the like.

2. Description of the Related Art

For a thin film where conventional thin film semiconductor devices, which are thin film transistors (TFTs) chiefly used for the image display device or the like, are formed, high temperature poly-Si has been predominantly employed. The high temperature poly-Si is constituted by polycrystalline silicon (Si) formed on a quartz substrate by high temperature heat treatment at a temperature of about 900° C. The polycrystalline Si having a comparatively large grain diameter of 500-600 nm is thereby formed. The TFTs formed on the high temperature poly-Si use a Si thin film with a low grain boundary density and high crystallinity as channels. Thus, it can attain an electron mobility of 100 to 150 $cm^2/Vs$, which is near the electron mobility of single-crystal Si (~500 $cm^2/VS$, S. M. Sze, Physics of Semiconductor Devices, p. 29, Second Edition, Wiley). However, in order to endure a high temperature process, there is a need to employ an expensive quartz substrate for this high temperature poly-Si. For this reason, a cost reduction in the overall device is difficult due to a cost of the substrate. The widespread use of TFTs has been thereby limited.

In recent years, in place of the high temperature poly-Si, use of low temperature poly-Si has been increasingly studied. The low temperature poly-Si is polycrystalline Si obtained by crystallizing amorphous Si formed on a low-cost glass or plastic substrate by a plasma CVD method, using a melting and recrystallizing method such as excimer laser annealing. With this approach, a polycrystalline Si thin film can be formed at a low temperature up to 150° C. Thus, a very cheap TFT can be formed. The low temperature poly-Si hitherto formed, however, had a grain size smaller than the high temperature poly-Si, and its surface roughness became noticeable. Further, only the polycrystalline Si with random surface orientations could be formed. When crystal grains are small, the density of grain boundaries in a carrier path increases. On the other hand, when the surface roughness is large, a breakdown voltage with respect to a gate voltage decreases. Further, when the surface orientations are random, trap level density of a grain boundary relatively increases. In either case, transistor characteristics are deteriorated. For this reason, the electron effect mobility of TFTs manufactured, using the conventional low temperature poly-Si as a material for the devices, was limited to approximately 150 $cm^2/Vs$. With such a small electron mobility, a required device speed cannot be achieved. Thus, a problem arises that the types of devices that can be formed on the identical glass or plastic substrate are limited. In the case of an image display device, for example, a pixel unit can be formed on glass or plastic, but other circuits such as for a source driver, a gate driver, a decoder, a buffer, a shift register, a digital-to-analog converter, and a peripheral controller must be formed on a conventional printed circuit board. Then, the peripheral circuit unit and the substrate must be connected by a cable terminal for use. With this method, the size of a screen is reduced. In addition, the cost of the overall device increases.

In order to solve these problems, a technique for increasing the diameter of a crystal grain, planarizing a surface of the film, and aligning positions of crystal grains and their surface orientations is required. There have been proposed various techniques for increasing the crystal grain diameter, planarizing the film surface, and controlling the crystal grain positions and their surface orientations of the low temperature poly-Si. One such technique is disclosed in JP-A-7-321339. In this technique, a metal element for selectively promoting crystallization is introduced into an amorphous Si film formed on an insulating substrate to bring about growth of crystals in parallel with the substrate, thereby forming polycrystalline Si having a [111] axis in a carrier moving direction. Another technique is disclosed in JP-A-10-41234. In this technique, the shape of a beam for heat treatment and the moving amount of irradiation are precisely controlled, thereby forming rectangular polycrystalline Si having a <100> axis in a direction perpendicular to the substrate and a {220} surface in parallel with or at a 45 degrees with respect to a beam scanning direction. Another such technique is disclosed in JP-A-8-55808. In this technique, a first polycrystalline Si layer is formed on the substrate and seed crystals having one of specific surfaces {100}, {110}, and {111} are formed by anisotropic etching. Then, a second polycrystalline Si layer is formed thereon, thereby forming a layer of columnar polycrystalline Si having aligned surface orientations. However, in spite of these numerous attempts, a TFT with a sufficiently high mobility has thus far not been achieved.

The above-mentioned crystallization methods cannot be said to adequately fulfill the above desired requirements. For example, in these prior techniques, the maximum attainable grain diameter was about 2 μm, which is an inadequate value. This is less than about 8 μm, which is the practical size of a thin film transistor required for a large-screen liquid crystal display panel, much less for enabling reduction in device variations due to positional deviation of crystal grains. The more important problem is roughness of a Si thin film surface. In the crystallization method using a laser, especially an excimer laser, due to volume expansion during a melting and solidifying process of silicon, crystal grains collide with each other to lift up grain boundaries, thereby forming projections of the grain boundaries. In the case of annealing using the excimer laser, these projections are actually so high that they correspond to the film thickness of the original Si thin film. They sometimes extend to even 50 to 100 nm. If these projections are formed, the breakdown voltage with respect to the gate voltage is remarkably reduced, so that a gate leakage current is readily produced. For this reason, under present circumstances, though the mobility is expected to be traded off, the thickness of the gate insulation film is increased, as a measure against this reduction in the breakdown voltage. These techniques have not reached a level to replace an existing low-function thin film transistor device. Further, optimum lattice structures or optimum crystal surface orientations of Si crystals in contact with the substrate are not realizable from these techniques, which are also a cause of the above-mentioned problems, and which lead to an intrinsic limit as determined by deformation of an interface between the silicon crystals and the substrate, irrespective of methods for film formation and heat treatment.

SUMMARY OF THE INVENTION

In order to realize a high-performance, large area image display device at low cost, the present invention has been made. It is, therefore, an object of the present invention to provide a technique for realizing a TFT with a high mobility. In this technique, surface orientations of Si crystals of low-temperature poly-Si, which is a material for TFTS, having an optical lattice structure in view of deformation of an interface with the substrate are aligned, and the grain diameter of the low temperature poly-Si is increased to become the grain diameter of pseudo single crystals. Further, in this technique, the surface of the film is planarized so that a sufficient gate breakdown voltage can be ensured.

In order to solve the above-mentioned problems, in a thin film semiconductor device according to the present invention, instead of performing momentary melting and solidification by irradiation of a pulsed beam with an excimer laser, a light beam modulated on time axis and spatially is irradiated using a solid laser, thereby realizing crystal growth that is nearly optimum for a structure and a growth speed of crystals in a Si thin film. Crystal grains with a large diameter and flat surfaces, and with their surface orientations controlled are thereby formed. Then, by using these crystal grains, a high-mobility TFT is realized.

According to the present invention, a channel can be formed of rectangular crystal grains with a large diameter and small surface roughness. A high-mobility thin film transistor with a high gate breakdown voltage can thereby be realized. With transistors configured as described above, it becomes possible to intensively form a pixel unit and peripheral circuitry on an identical glass substrate. Accordingly, a high-function thin film semiconductor device and an image display device using these thin film semiconductor devices can be obtained.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention will be described in detail with reference to appended drawings.

Herein, equivalent crystal orientations such as [100], [010], and [001] are collectively represented as <100>. The same representation holds true for the other orientations <110> and <111> as well.

First Embodiment

Figure 1A:
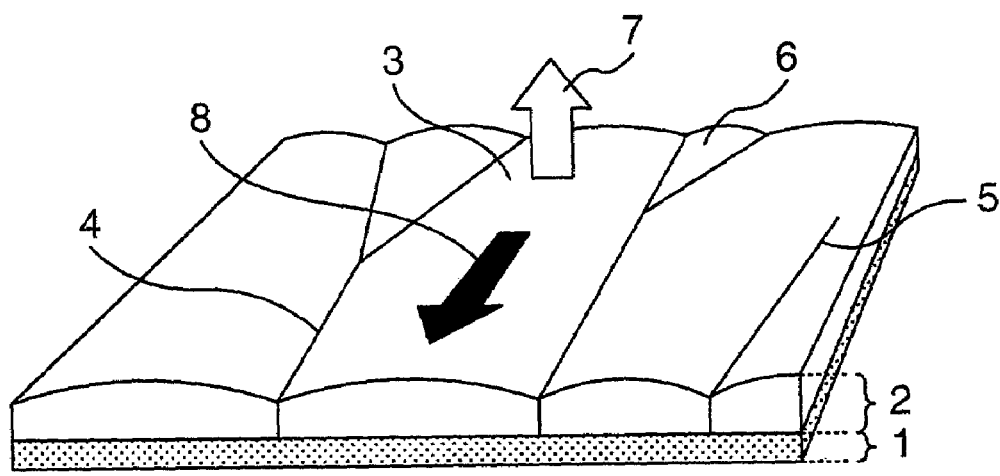
FIG. 1A is a diagram showing a perspective view of a crystal structure of a Si thin film of a channel region in a thin film transistor according to a first embodiment of the present invention, obliquely seen from above.
Figure 1B:
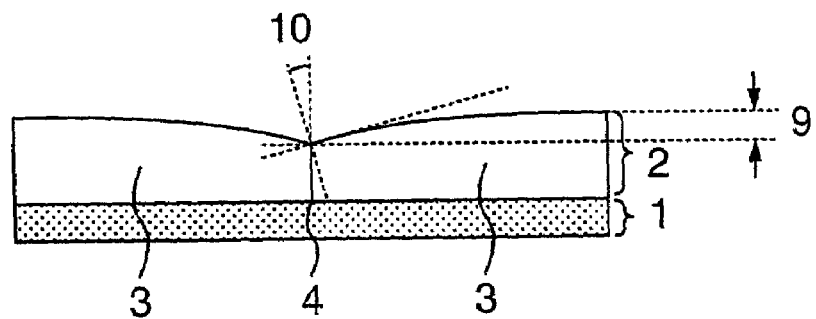
FIG. 1B is a cross sectional view of a grain boundary according to the first embodiment of the present invention.

FIGS. 1A and 1B are diagrams explaining a thin film structure of a channel region of a thin film semiconductor device according to a first embodiment of the present invention. FIG.

1A is a perspective view obliquely seen from above, and FIG. 1B is a cross sectional view of a grain boundary. A silicon thin film 2 is formed over an insulating substrate 1. The silicon thin film 2 is formed of a polycrystal constituted by a plurality of rectangular crystal grains 3 each having a narrow shape. The surfaces of the rectangular crystal grains 3 are recessed at grain boundaries 4, in particular. The rectangular crystal grains 3 have an average length of 5 μm and an average width of 0.8 to 3 μm. Among the grain boundaries, in addition to a grain boundary that is simply continuous in a longitudinal direction, there are some grain boundaries shaped like a grain boundary 5 that is generated midway through a crystal grain and a grain boundary 6 with two grain boundaries forking midway through a crystal grain. When current is passed through the crystal grains having such boundaries in their longitudinal direction, there are few grain boundaries that traverse a current flowing direction. Thus, the crystal grains have a very high mobility. Further, the grain boundaries 4 are recessed, so that a breakdown voltage with respect to a gate voltage is improved.

The crystal shape described above is formed by scanning a solid laser beam in parallel with an orientation 8. The shape of the crystal is formed, when crystallization is performed, if effective energy E irradiated to the silicon thin film satisfies a relation of a <E<c, in terms of a scanning speed and radiation energy, at that moment. In this relation, a denotes energy required for complete melting of silicon, while c denotes energy required for aggregating silicon. Since a range of this crystallization condition is wide, a sufficient process margin can be ensured. In other words, it is an irradiating condition that can be applied to a large-sized substrate with high throughput.

In a case where the insulating substrate 1 is made of glass and the thickness of the silicon thin film 2 is 50 nm, a crystal orientation 7 of the rectangular crystal grains 3 perpendicular to the substrate that is the most predominant is a <110> crystal orientation. The crystal orientation 8 in the longitudinal direction of the crystal grains that is the most predominant is a <100> crystal orientation. A difference in film thickness between that at a recessed grain boundary, described before, and these surface orientations exists in dependence on: the thickness of the Si thin film 2, surface materials of the insulating substrate 1, presence or absence of a base film such as SiO2 or SiN on a surface of the substrate 1, and its film thickness. Generally, the higher wettability between the silicon thin film 2 and the insulating substrate 1 is, the larger the roughness of the recessed grain boundary becomes, and with this tendency, the <100> crystal orientation tends to become the most predominant as the crystal orientation 7. When the crystal orientation 7 changes, an orientation geometrically permissible, or the <100> or <110> crystal orientation alone becomes principal as the crystal orientation 8 perpendicular to the crystal orientation 7.

In the present invention, a description is primarily given in a case where the orientation 7 is <110> and the orientation 8 is <100>. However, by controlling the thickness of the Si thin film and materials and the thickness of the base film, it is possible to make the orientation 7 to be <100>, and to make the orientation 8 to be <100> or <110>. When the orientation 7 is the <100>, mobility when current is passed in the orientation 8 becomes a maximum in an n-type transistor. On the other hand, when the orientation 7 is the <110>, the mobility becomes a maximum in a p-type transistor. This means that if the orientation <100> is used for the n-type transistor and the orientation <110> is used for the p-type transistor, a highest-performance semiconductor device having the n-type and p-type transistors mixed therein, such as a complementary MOS (CMOS) semiconductor device, can be realized. On the contrary, if the orientation <110> is used for the n-type transistor and the orientation <100> is used for the p-type transistor, a mobility difference between the n-type transistor and the p-type transistor is reduced, though the mobility of the n-type transistor is originally about twice the mobility of the p-type transistor.

In an actual circuit design, when the mobility of the n-type transistor is close to the mobility of the p-type transistor, designing becomes easy, even if the n-type and p-type transistors do not have the highest performance. In most peripheral circuits, by using a semiconductor device having n-type and p-type transistors with their mobilities close to each other, design margins can be improved. The present invention is characterized by having a great advantage that, by controlling crystal orientations in the above-mentioned manner, transistors with required performance can be applied to required circuits.

FIG. 1B shows a section of the grain boundary. The roughness of the recessed grain boundary can be represented by a film thickness difference 9 between average film thickness of the grain boundaries and intra-grain average film thickness. Alternatively, the roughness of the recessed grain boundary can also be represented by an angle 10 between a line normal to the surface of the Si thin film and a line normal to the substrate at the grain boundary. These representations are correlated with each other.

Crystals are formed into a kind of droplets in a direction perpendicular to a laser scanning direction during a melting and solidifying process by a solid laser. Traces of the droplets may be considered to be the rectangular crystal grains 3 in a convex form that extend longitudinally in the scanning direction. This is a phenomenon greatly different from crystallization by an excimer laser, which is a conventional technique. With the excimer technique, as described above, volume expansion during the melting and solidifying process is concentrated into the grain boundaries, thereby forming upward convex grain boundaries.

With the solid laser, crystals grow in a horizontal direction due to laser beam scanning during the melting process. For this reason, with the volume expansion being stored at grown crystal tips without cessation, the crystal grains are brought into parallel contact with each other. Thus, pressure of the volume expansion is not applied to the grain boundaries, so that recessed grain boundaries are formed due to the effect of surface tension caused by the Si droplets. The higher the wettability between the Si thin film and the substrate surface is, these droplets tend to be rounded more, thereby increasing the film thickness difference 9 and the angle 10 at the same time. On the contrary, when the wettability is small, the film thickness difference 9 and the angle 10 are reduced. When crystallization is performed with the configuration of the film and the laser irradiation condition described above, the film thickness difference of 10 to 20 nm and the angle 10 of 60 to 80 degrees are formed most.

The first embodiment is characterized in that, by using crystals having the shape described above as channels, transistors with a high mobility and a high gate breakdown voltage can be formed with high process throughput.

Second Embodiment

Figure 2A:
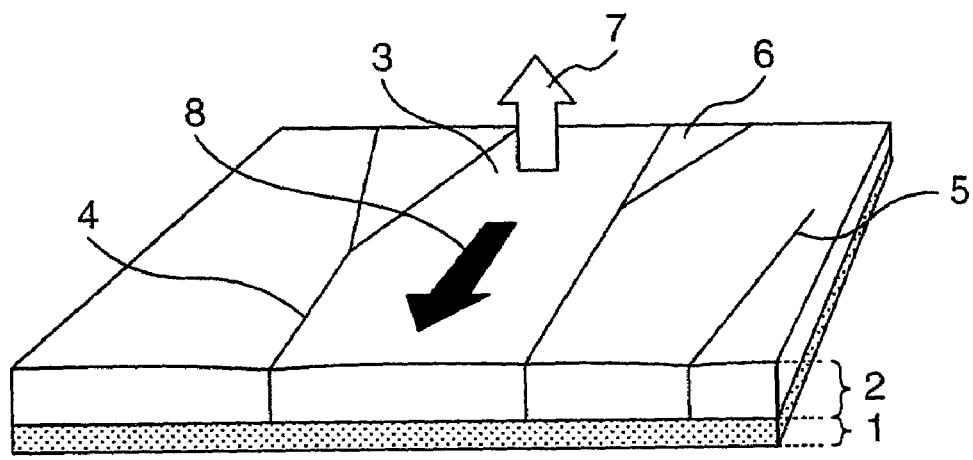
FIG. 2A is a diagram showing a perspective view of a crystal structure of a Si thin film of a channel region in a thin film transistor according to a second embodiment of the present invention, obliquely seen from above.
Figure 2B:
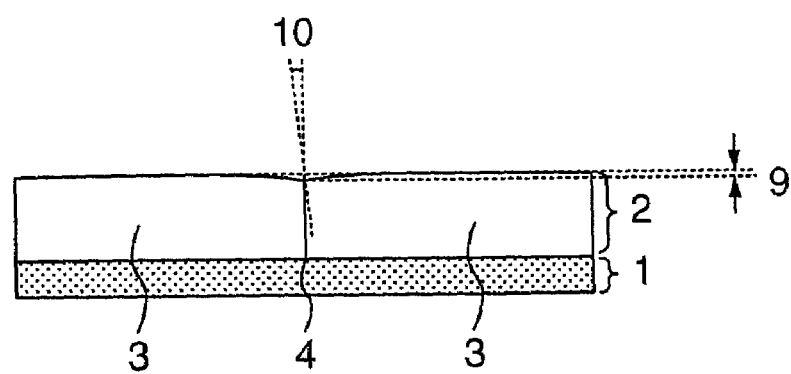
FIG. 2B is a cross sectional view of a grain boundary according to the second embodiment of the present invention.

FIGS. 2A and 2B are diagrams explaining a thin film structure of the channel region in a thin film semiconductor device according to a second embodiment of the present invention. FIG. 2A is a perspective view obliquely seen from above, and FIG. 2B is a cross sectional view of a grain boundary. The second embodiment is different from the first embodiment in that the recess of the grain boundary seen in the second embodiment is extremely flat, and an intra-grain surface of a rectangular crystal grain 3 is also flat. The rectangular crystal grains 3 have an average length of 5 μm and have an average width of 0.8 to 3 μm, as in the first embodiment. Further, as in the first embodiment, among grain boundaries, in addition to a grain boundary that is simply continuous in the longitudinal direction, there are some grain boundaries shaped like the grain boundary 5 that is generated midway through a crystal grain and the grain boundary 6 with two grain boundaries forking midway through a crystal grain. When current is passed through the crystal grains in their longitudinal direction, the crystal grains have high mobility. Further, especially because the grain boundaries and interiors of crystals are flat, an extremely high breakdown voltage with respect to the gate voltage can be ensured. In other words, the thickness of a gate insulation film can be made to be thinner than 100 nm in a current state, such as not more than 50 nm.

In this second embodiment, the crystal shape is formed, when crystallization is performed, if the effective energy E irradiated to the silicon thin film satisfies a relation of a<E<b, in terms of the scanning speed and the radiation energy, at that moment. In this relation, a denotes the energy required for complete melting of silicon, while b denotes energy required for Si droplet formation. Further, a relation of b<c holds with respect to the energy c for aggregating silicon, described in the first embodiment. Since the range of this crystallization condition is very narrow, the process margin cannot be ensured. However, crystals to be formed are placed in the best condition. For this reason, if these crystals are applied to a high-function circuit alone that does not require a large area, a semiconductor device and an image display device with extremely high performance can be realized. The same as in the first embodiment holds true for the crystal orientations 7 and 8. Such flat grain boundaries and interiors of the rectangular crystal grains differ, depending on the thickness of the silicon thin film 2, surface materials of the insulating substrate 1, presence or absence of the base film of a material such as SiO2 or SiN and its film thickness, in addition to the above-mentioned irradiation condition. Generally, when the wettability between the silicon thin film 2 and the insulating substrate 1 is the lowest and the thickness of the silicon thin film 2 is larger than 50 nm, such flat structures of the grain boundaries and such flat intra-grain structures tend to be formed.

FIG. 2B shows a section of the grain boundary. In the second embodiment, the film thickness difference 9 is extremely small, and the angle 10 is very near to 0 degree. It means that the Si droplet formation is difficult to occur. By using the crystals with such a shape as channels and applying transistors with a high mobility and a very high gate breakdown voltage to a circuit unit that requires high performance, a high-function semiconductor device can be obtained.

Third Embodiment

Figure 3A:
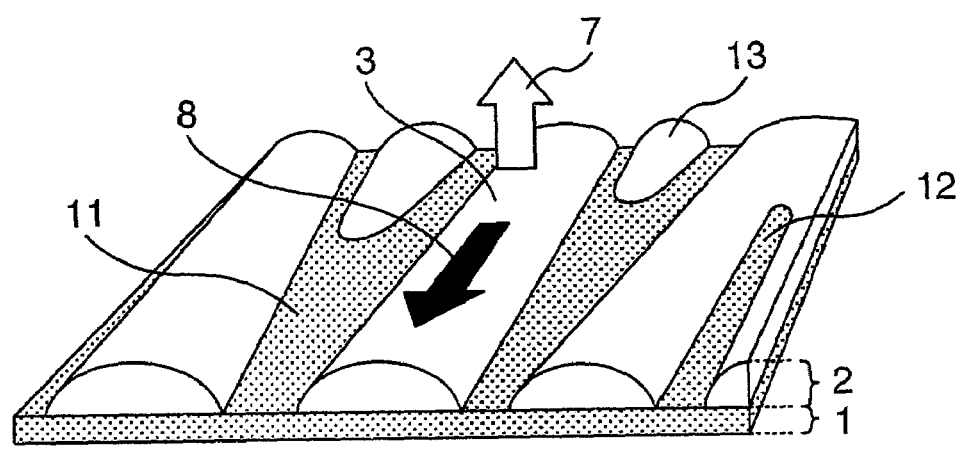
FIG. 3A is a diagram showing a perspective view of a crystal structure of a Si thin film of a channel region in a thin film transistor according to a third embodiment of the present invention, obliquely seen from above.
Figure 3B:
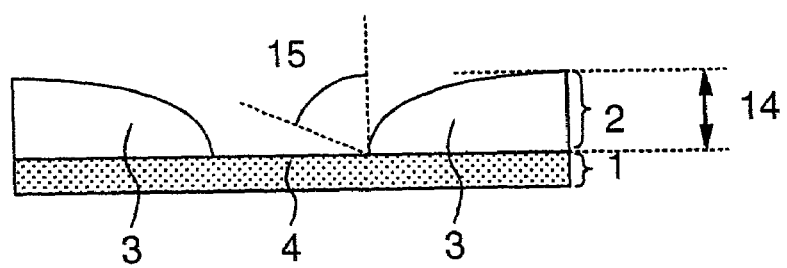
FIG. 3B is a cross sectional view of a grain boundary according to the third embodiment of the present invention.

FIGS. 3A and 3B are diagrams explaining a thin film structure of the channel region of a thin film semiconductor device according to a third embodiment of the present invention. FIG. 3A is a perspective view obliquely seen from above, and FIG. 3B is a section of a grain boundary. Differing from the second embodiment, in this embodiment, the recess of the grain boundary has become larger than the thickness of the silicon thin film 2. Thus, this embodiment has completely-separated-type grain boundaries 11 at which the silicon thin film 2 has been separated from the substrate 1, so that the surface of the substrate 1 has appeared. Further, the surfaces of the rectangular crystal grains 3 are greatly lifted up to form convex surfaces. The rectangular crystal grains 3 have an average length of 5 μm, as in the first and second embodiments, and an average width of 0.5 to 2 μm. The second embodiment is the same as the first embodiment in that among completely-separated-type grain boundaries, where separation of the Si thin film 2 has occurred, there are some grain boundaries shaped like a grain boundary 12 that is generated midway through a crystal grain and a grain boundary 13 with two grain boundaries forking midway through a crystal grain. Most of the crystal grains are constituted by single crystals within their inside. Thus, when current is passed through the crystal grains in their longitudinal direction, the effect of reducing the mobility due to scattering of the grain boundaries is not produced. Thus, high mobility as attained by the single crystals is achieved. Further, since the surfaces of the rectangular crystal grains 3 are smooth curved surfaces, the breakdown voltage with respect to the gate voltage can be ensured to a certain extent. In other words, it means that with the gate breakdown voltage kept unaltered in the current state, transistors having performance comparable to the performance of the transistors on the film constituted by single crystals can be formed on the insulating substrate 1. However, the second embodiment has a disadvantage that the amount of the current passing through a crystal grain is small, so that, in order to solve this problem, it is necessary to form a transistor having a large width.

In this embodiment, the crystal shape is formed, when crystallization is performed, if the effective energy E irradiated to the silicon thin film satisfies a relation of c <E<d, in terms of the laser scanning speed and the radiation energy, at that moment. In this relation, c denotes the energy required for aggregating silicon, which is the same as the energy c in the first embodiment, and d denotes energy required for evaporating silicon. This crystallization condition has a wide process margin that is about the same as in the first embodiment. These crystals are suited to an arithmetic circuit that has high mobility and does not need high driving current. If these crystals are applied to the arithmetic circuit, a semiconductor device and an image display device with extremely high performance can be realized. The same as in the first embodiment holds true for the crystal orientations 7 and 8 in this embodiment.

Such aggregated-type grain boundaries and interiors of the rectangular crystal grains differ, depending on the thickness of the silicon thin film 2, surface materials of the insulating substrate 1, presence or absence of the base film of a material such as SiO2 or SiN and its film thickness, in addition to the above-mentioned irradiation condition. Generally, when the wettability between the silicon thin film 2 and the insulating substrate 1 is the highest and the thickness of the silicon thin film 2 is equal to or less than 50 nm, such aggregated-type structures of the grain boundaries and such aggregated-type intra-grain structures tend to be formed.

FIG. 3B shows a section of the grain boundary. In the third embodiment, a film thickness difference 14 is extremely large, and the film thickness difference 14 sometimes reaches approximately 100 nm when the thickness of the Si thin film before crystallization is 50 nm. An angle 15 is very large and sometimes exceeds 45 degrees. By using the crystals having such a shape as channels and applying transistors with the highest mobility to a logic circuit unit that requires the highest performance, a high-function semiconductor device can be obtained.

Fourth Embodiment

Figure 4A:
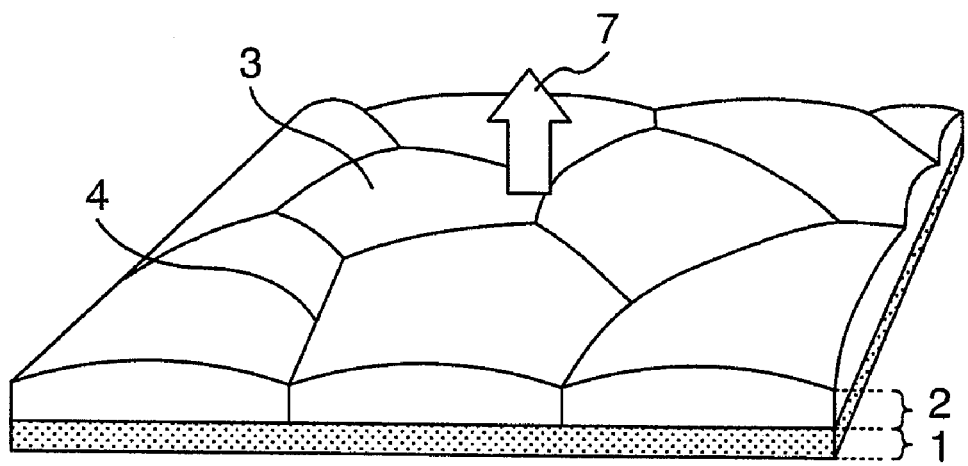
FIG. 4A is a diagram showing a perspective view of a crystal structure of a Si thin film of a channel region in a thin film transistor according to a fourth embodiment of the present invention, obliquely seen from above.
Figure 4B:
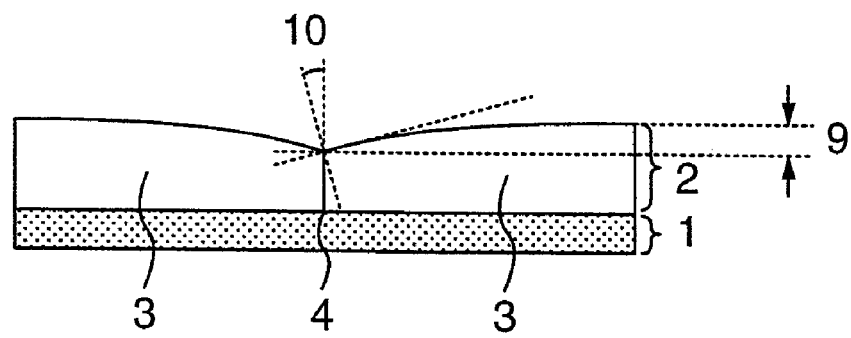
FIG. 4B is a cross sectional view of a grain boundary according to the fourth embodiment of the present invention.

FIGS. 4A and 4B are diagrams explaining a thin film structure of the channel region of a thin film semiconductor device according to a fourth embodiment of the present invention. FIG. 4A is a perspective view obliquely seen from above, and FIG. 4B is a section of a grain boundary. Differing from the first through third embodiments, crystal grains in this embodiment are not rectangular, but polygonal. Grain boundaries are, however, recessed as in the first to the third embodiments. An average diameter of the crystal grains 3 is 1-2 μm. Most of the crystal grains have a single crystal structure within their insides. However, because they have no specific longitudinal direction, when current is passed through the crystal grains, the effect of reducing mobility due to scattering of the boundaries is larger than that in the first to the third embodiments. However, since the grain boundaries are recessed, crystals in this embodiment have a higher gate breakdown voltage than crystals obtained by the conventional excimer laser crystallization method. In other words, a transistor having a mobility that is almost the same as the mobility of a transistor obtained by the conventional technique and, also, having a higher gate breakdown voltage can be formed.

In the fourth embodiment, the crystal shape can be obtained, when crystallization is performed, if the effective energy E irradiated to the silicon thin film satisfies a relation of E<a, in terms of the laser scanning speed and the radiation energy, at that moment, and then etching is performed with an anisotropic solution of silicon to selectively reduce grain boundaries having a weak crystal bond. In this relation, a denotes the energy required for completely melting silicon, which is the same as the energy a in the first embodiment. The range of this crystallization condition is wider than the crystallization condition in the first embodiment, and has a higher process throughput. By applying these crystals to channel regions of transistors on a large area, such as a pixel unit of an image display device, which do not require a very high mobility, a semiconductor device and an image display device with very high performance can be realized. The same as in the first embodiment holds true for the crystal orientation 7 in this embodiment.

These polygonal crystal grains and grain boundaries can also be formed by applying selective etching of grain boundaries to crystal grains obtained by crystallization using the conventional excimer laser as well the above-mentioned solid laser.

Fifth Embodiment

Figure 5:
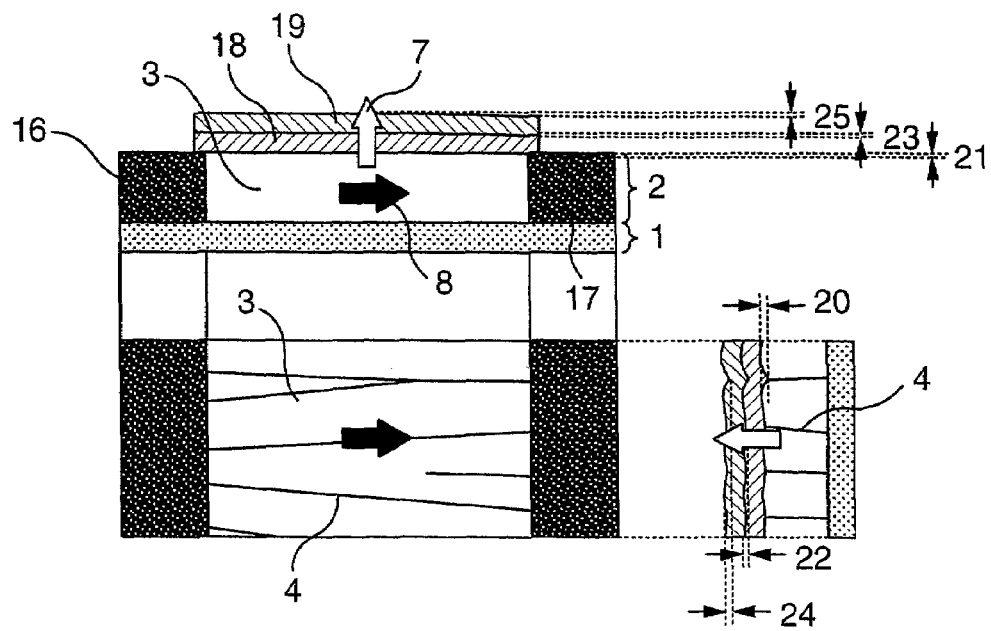
FIG. 5 is a diagram including in an upper portion thereof a cross sectional view of a thin film transistor according to a fifth embodiment of the present invention, a top view of the thin film transistor in a lower left portion thereof, and a cross sectional view of the thin film transistor in a lower right portion thereof seen from a direction 90 degrees different from a section in the upper portion thereof.

FIG. 5 is a diagram of a thin film transistor according to a fifth embodiment of the present invention. An upper half portion of the figure is a cross sectional view, a lower left portion of the figure is a top view of a channel region seen from above, and a lower right portion of the figure is a cross sectional view obtained by drawing the cross sectional view in the upper half portion of the figure from an angle 90 degrees different. The silicon thin film 2 is formed over the insulating substrate 1. The silicon thin film 2 has the rectangular crystal grains 3 that are the same as those in the first embodiment. With the crystal structure in the first embodiment taken as an example, a description will be given below. The same, of course, also holds true for a case where the silicon thin film 2 has the crystal structure in the second embodiment or the third embodiment. A source 16 and a drain 17 are formed using parts of the silicon thin film 2. A gate insulation film 18 is formed over a channel, and a gate 19 is formed over the gate insulation film 18.

This embodiment is characterized in that the longitudinal direction of the rectangular crystal grains 3 of the silicon thin film 2 coincides with a direction connecting the source 16 and the drain 17, as shown in FIG. 5. With this direction, as described above, the channel with a high mobility in the current flowing direction is formed. At the same time, the advantage of the first embodiment that the gate breakdown voltage is high because the grain boundaries of crystals are recessed is also obtained.

This embodiment is characterized in that surface roughness (a height difference between a top of a convex portion and a bottom of a concave portion) of the silicon thin film or the source or the drain, the gate insulation film, or the gate in the direction where the source and the drain is connected within the channel is smaller than the surface roughness of the silicon thin film or the source or the drain, the gate insulation film, or the gate in the direction perpendicular thereto. In other words, a surface roughness 21, a surface roughness 23, or a surface roughness 25 in FIG. 5 is smaller than a surface roughness 20, a surface roughness 22, or a surface roughness 24 in FIG. 5, respectively.

Sixth Embodiment

Figure 6:
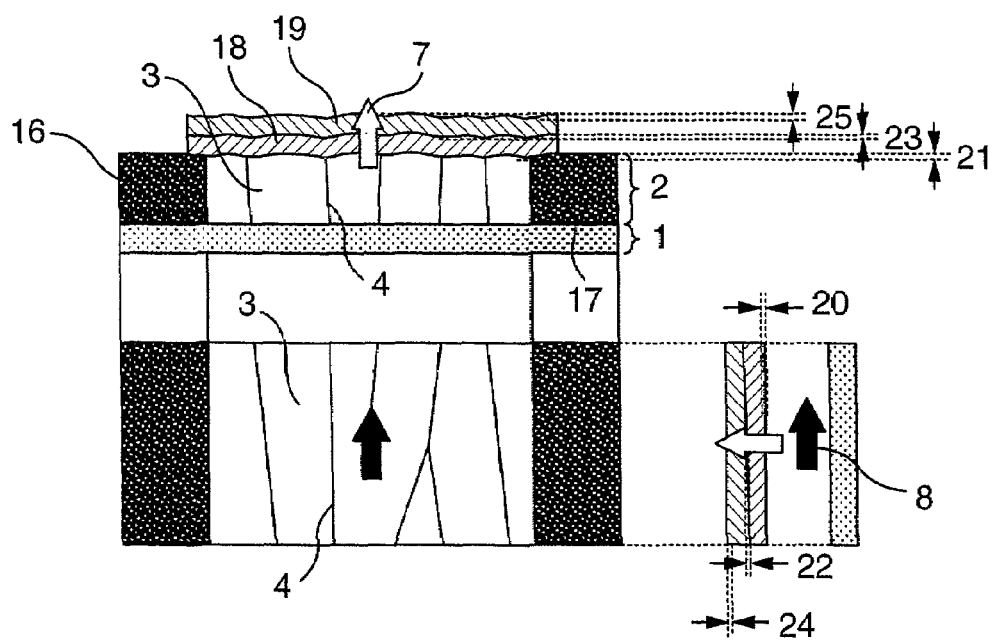
FIG. 6 is a diagram including in an upper portion thereof a cross sectional view of a thin film transistor according to a sixth embodiment of the present invention, a top view of the thin film transistor in a lower left portion thereof, and a cross sectional view of the thin film transistor in a lower right portion thereof seen from a direction 90 degrees different from a section in the upper portion thereof.

FIG. 6 is a diagram of a thin film transistor according to a sixth embodiment of the present invention. The upper half portion of the figure is a cross sectional view, the lower left portion of the figure is a top view of a channel region seen from above, and the lower right portion of the figure is a cross sectional view obtained by drawing the cross sectional view in the upper half portion of the figure from an angle 90 degrees different. The silicon thin film 2 is formed over the insulating substrate 1. The silicon thin film 2 has the rectangular crystal grains 3 that are the same as those in the first embodiment. With the crystal structure in the first embodiment taken as an example, a description will be given below. The same, of course, also holds true for the case where the silicon thin film 2 has the crystal structure in the second embodiment or the third embodiment. The source 16 and the drain 17 are formed using parts of the silicon thin film 2. The gate insulation film 18 is formed over the channel, and the gate 19 is formed over the gate insulation film 18.

This embodiment is characterized in that the longitudinal direction of the rectangular crystal grains 3 of the silicon thin film 2 coincides with a direction perpendicular to the direction where the source 16 and the drain 17 are connected, as shown in FIG. 6. With this direction, the mobility in the current flowing direction is reduced more than in the fifth embodiment. However, on the other hand, the number of grain boundaries that traverse the current flowing direction comparatively increases, thereby reducing variations in the mobility between devices. This advantage can be applied to a circuit where high mobility such as that according to the fifth embodiment is not required but, however, variations in a transistor threshold are to be kept to a minimum. By applying the thin film transistor in this embodiment to the n-type transistor of a CMOS semiconductor device and applying the thin film transistor in the fifth embodiment to the p-type transistor of the CMOS semiconductor device, for example, a circuit configuration having a balance between the n-type transistor and the p-type transistor can be obtained. Since the grain boundaries of crystals in this embodiment are also recessed, the gate breakdown voltage is also high.

This embodiment is characterized in that the surface roughness (the height difference between the top of the convex portion and the bottom of the concave portion) of the silicon thin film or the source or the drain, the gate insulation film, or the gate in the direction where the source and the drain is connected within the channel is larger than the surface roughness of the silicon thin film or the source or the drain, the gate insulation film, or the gate in the direction perpendicular thereto. In other words, the surface roughness 21, the surface roughness 23, or the surface roughness 25 in FIG. 6 is larger than the surface roughness 20, the surface roughness 22, or the surface roughness 24 in FIG. 6, respectively.

Seventh Embodiment

Figure 7:
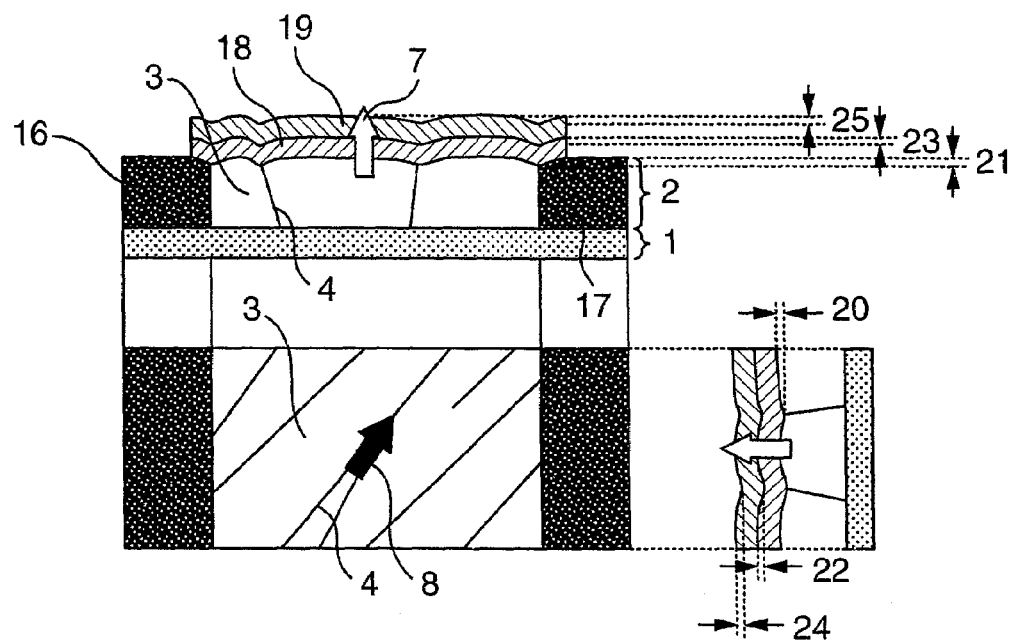
FIG. 7 is a diagram including in an upper portion thereof a cross sectional view of a thin film transistor according to a seventh embodiment of the present invention, a top view of the thin film transistor in a lower left thereof, and a cross sectional view of the thin film transistor in a lower right thereof seen from a direction 90 degrees different from a section in the upper portion thereof.

FIG. 7 is a diagram of a thin film transistor according to a seventh embodiment of the present invention. The upper half portion of the figure is a cross sectional view, the lower left portion of the figure is a top view of a channel region seen from above, and the lower right portion of the figure is a cross sectional view obtained by drawing the cross sectional view in the upper half portion of the figure from an angle 90 degrees different. The silicon thin film 2 is formed over the insulating substrate 1. The silicon thin film 2 has the rectangular crystal grains 3 that are the same as those in the first embodiment. With the crystal structure in the first embodiment taken as an example, a description will be given below. The same, of course, also holds true for the case where the silicon thin film 2 has the crystal structure in the second embodiment or the third embodiment. The source 16 and the drain 17 are formed using parts of the silicon thin film 2. The gate insulation film 18 is formed over the channel, and the gate 19 is formed over the gate insulation film 18.

This embodiment is characterized in that the longitudinal direction of the rectangular crystal grains 3 of the silicon thin film 2 is obliquely inclined from the direction where the source 16 and the drain 17 are connected, as shown in FIG. 7. With this direction, the mobility in the current flowing direction becomes a value intermediate between mobility values in the fifth and sixth embodiments. Further, the number of grain boundaries that traverse the current flowing direction also becomes a value intermediate the numbers of the grain boundaries in the fifth and sixth embodiments. Accordingly, variations in the mobility between devices also become values intermediate between the variation values in the fifth and sixth embodiments.

The advantage of having such a structure is that, by applying this structure to a transistor that needs to be intermingled within the region of the transistors according to the fifth or sixth embodiment, with its source-drain direction inclined, for the sake of a layout rather than a performance constraint as in the fifth and sixth embodiments, a layout constraint can be eased. This structure can be applied to a circuit such as the one for a single switching element in part of a region where large area buffer transistors are contiguously present. Since the grain boundaries of crystals in this embodiment are also recessed, the gate breakdown voltage is also high. In this embodiment, the surface roughness of a rectangular crystal grain 3 in its longitudinal direction is different from the surface roughness of the rectangular crystal grain 3 in a direction perpendicular to the longitudinal direction.

This embodiment is thus characterized in that the surface roughness (the height difference between the top of the convex portion and the bottom of the concave portion) of the silicon thin film or the source or the drain, the gate insulation film, or the gate in the source-drain connecting direction within the channel is different from the surface roughness of the silicon thin film or the source or the drain, the gate insulation film, or the gate in the direction perpendicular thereto. In other words, the surface roughness 21, the surface roughness 23, or the surface roughness 25 in FIG. 7 is different from the surface roughness 20, the surface roughness 22, or the surface roughness 24 in FIG. 7, respectively.

Eighth Embodiment

Figure 8:
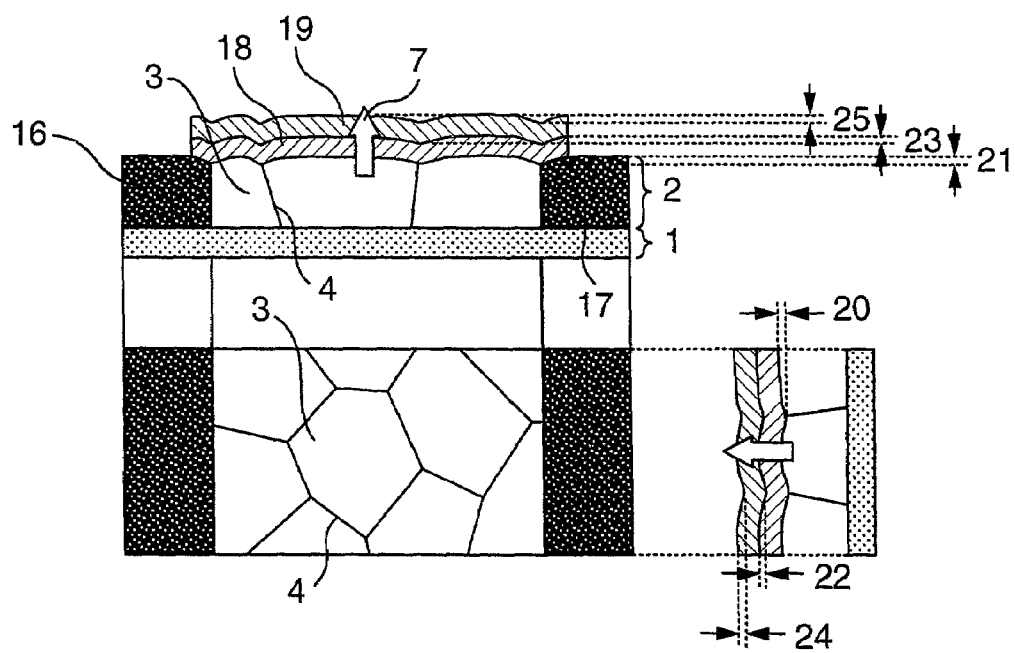
FIG. 8 is a diagram including in an upper portion thereof a cross sectional view of a thin film transistor according to an eighth embodiment of the present invention, a top view of the thin film transistor in a lower left portion thereof, and a cross sectional view of the thin film transistor in a lower right thereof seen from a direction 90 degrees different from a section in the upper portion thereof.

FIG. 8 is a diagram of a thin film transistor according to an eighth embodiment of the present invention. The upper half portion of the figure is a cross sectional view, the lower left portion of the figure is a top view of a channel region seen from above, and the lower right portion of the figure is a cross sectional view obtained by drawing the cross sectional view in the upper half portion of the figure from an angle 90 degrees different. The silicon thin film 2 is formed over the insulating substrate 1. The silicon thin film 2 has the polygonal crystal grains 3 that are the same as those in the fourth embodiment. The source 16 and the drain 17 are formed using parts of the silicon thin film 2. The gate insulation film 18 is formed over the channel. The gate 19 is formed over the gate insulation film 18.

With this structure, the mobility in the current flowing direction becomes lower than the mobilities in the fifth to seventh embodiments. However, since grain boundaries are recessed, the gate breakdown voltage is high. Further, since the throughput of laser crystallization for forming this crystal structure is the highest of all the throughputs in the fifth through seventh embodiments, this crystal structure can be applied to a large area pixel unit. In this case, the polygonal crystal grains 3 have no longitudinal direction.

This embodiment is thus characterized in that the surface roughness (the height difference between the top of the convex portion and the bottom of the concave portion) of the silicon thin film or the source or the drain, the gate insulation film, or the gate in the source-drain connecting direction within the channel is almost equal to the surface roughness of the silicon thin film or the source or the drain, the gate insulation film, or the gate in the direction perpendicular thereto. In other words, the surface roughness 21, the surface roughness 23, and the surface roughness 25 in FIG. 8 is almost the same as the surface roughness 20, the surface roughness 22, and the surface roughness 24 in FIG. 8, respectively.

Ninth Embodiment

Figure 9:
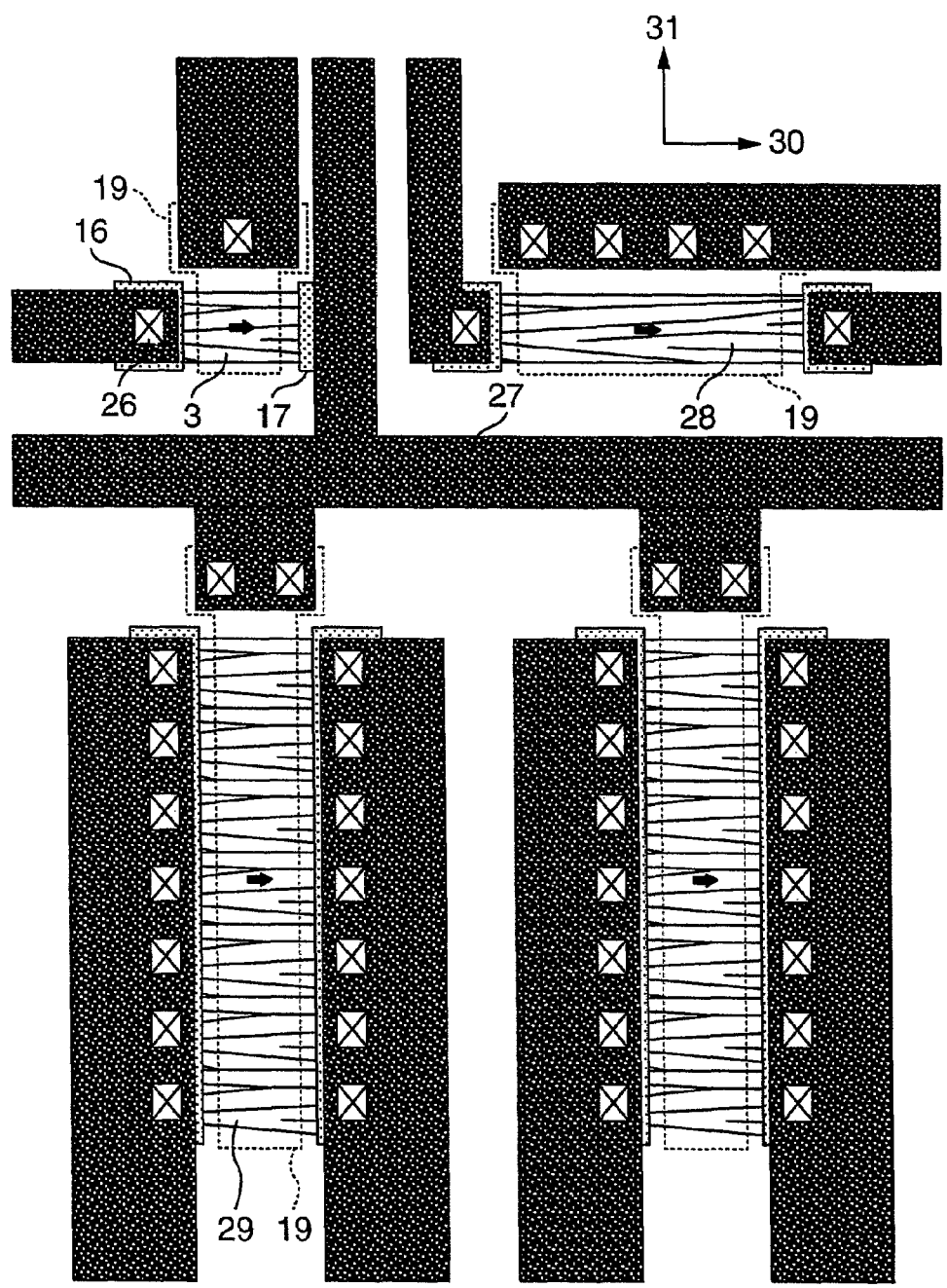
FIG. 9 shows an example of pattern formation according to a ninth embodiment of the present invention, when the transistors in the fifth embodiment have been applied to a circuit section of a semiconductor device.

FIG. 9 shows a pattern where the transistors in the fifth embodiment have been applied to the circuit unit of a semiconductor device. Contacts 26 are formed for the source 16, the drain 17, and the gate 19 of a transistor including the rectangular crystal grains 3, thereby establishing connection with a wire 27 formed on an interlayer insulation film. With the crystal structure in the fifth embodiment taken as an example, a description will be given below. The same, of course, also holds true for the crystal structure in the sixth or seventh embodiment.

In this semiconductor device, various types of transistors are intermingled. Among them are a transistor 28 that extends longitudinally in the source-drain connecting direction and transistors 29 that extend longitudinally in a direction perpendicular to the extending direction of the transistor 28. The reason why the transistors of various types are intermingled is that required transistor performance differs depending on the respective functions of circuits. A transistor 29, for example, is used a lot in a case where driving current or the amount of current at power-on rather than the mobility is especially required.

This embodiment is characterized in that the longitudinal directions of the rectangular crystal grains 3 in various transistors having such different sizes are aligned with a direction 30 parallel to the substrate. When a region that includes a group of aligned transistors is seen from above, it is found, as a characteristic of this embodiment, that the surface roughness (the height difference between the top of the convex portion and the bottom of the concave portion) of the silicon thin film or the source or the drain, the gate insulation film, or the gate in the source-drain connecting direction within the channel is smaller than the surface roughness of the silicon thin film or the source or the drain, the gate insulation film, or the gate in the direction perpendicular thereto. In other words, the surface roughness 21, the surface roughness 23, and the surface roughness 25 in FIG. 5 is smaller than the surface roughness 20, the surface roughness 22, and the surface roughness 24 in FIG. 5, respectively. By aligning the longitudinal directions of the rectangular crystal grains 3 within the region in this manner, it becomes enough to perform laser scanning through the region only one time. Accordingly, the throughput of a crystallization process is improved.

In this embodiment, the source-drain connecting direction is the same as the longitudinal direction 30 of the rectangular crystal grains. Even if the source-drain connecting direction is inclined with respect to or perpendicular to the longitudinal direction 30 of the rectangular crystal grains, the throughput of laser crystallization can of course be improved, too.

Tenth Embodiment

Figure 10:
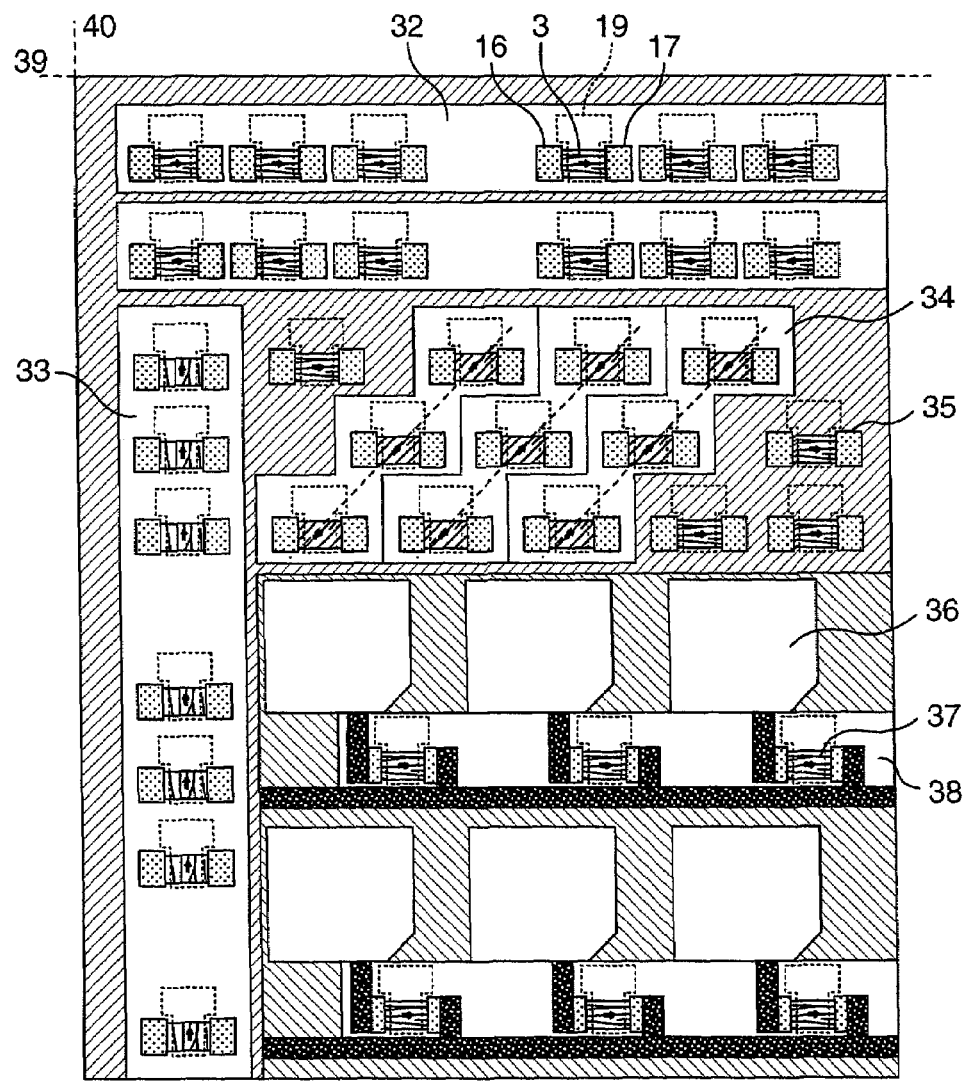
FIG. 10 is a layout diagram according to a tenth embodiment of the present invention, when regions with the aligned transistors in the ninth embodiment have been applied to a pixel unit and peripheral circuitry of an image display device.

FIG. 10 is a layout diagram where transistor regions including groups of aligned transistors in the ninth embodiment are applied to peripheral circuitry and a pixel unit of an image display device. The peripheral circuitry includes regions 32 including groups of transistors where the longitudinal directions of the rectangular crystal grains 3 are the same as the direction connecting the sources 16 and the drains 17, a region 33 including a group of transistors where the longitudinal directions of the rectangular crystal grains 3 are perpendicular to the direction connecting the sources 16 and the drains 17, a region 34 including groups of transistors where the longitudinal directions of the rectangular crystal grains 3 are inclined with respect to their spruce-drain connecting direction, and discrete transistors 35 that do not belong to any of the above-mentioned regions. The image display device also includes pixels 36 and transistors 37 for driving the pixels 36. The transistors 37 constitute regions where the longitudinal directions of the rectangular crystal grains 3 are the same as the longitudinal directions of the rectangular crystal grains 3 in the regions 32.

In this embodiment, the longitudinal direction of the region 32 coincides with a horizontal cutting plane line 39 for edges of the substrate. The longitudinal direction of the region 33 coincides with a vertical cutting plane line 40 for the edges of the substrate. With this layout structure, areas around the substrate can be utilized efficiently, without waste.

Eleventh Embodiment

Figure 11:
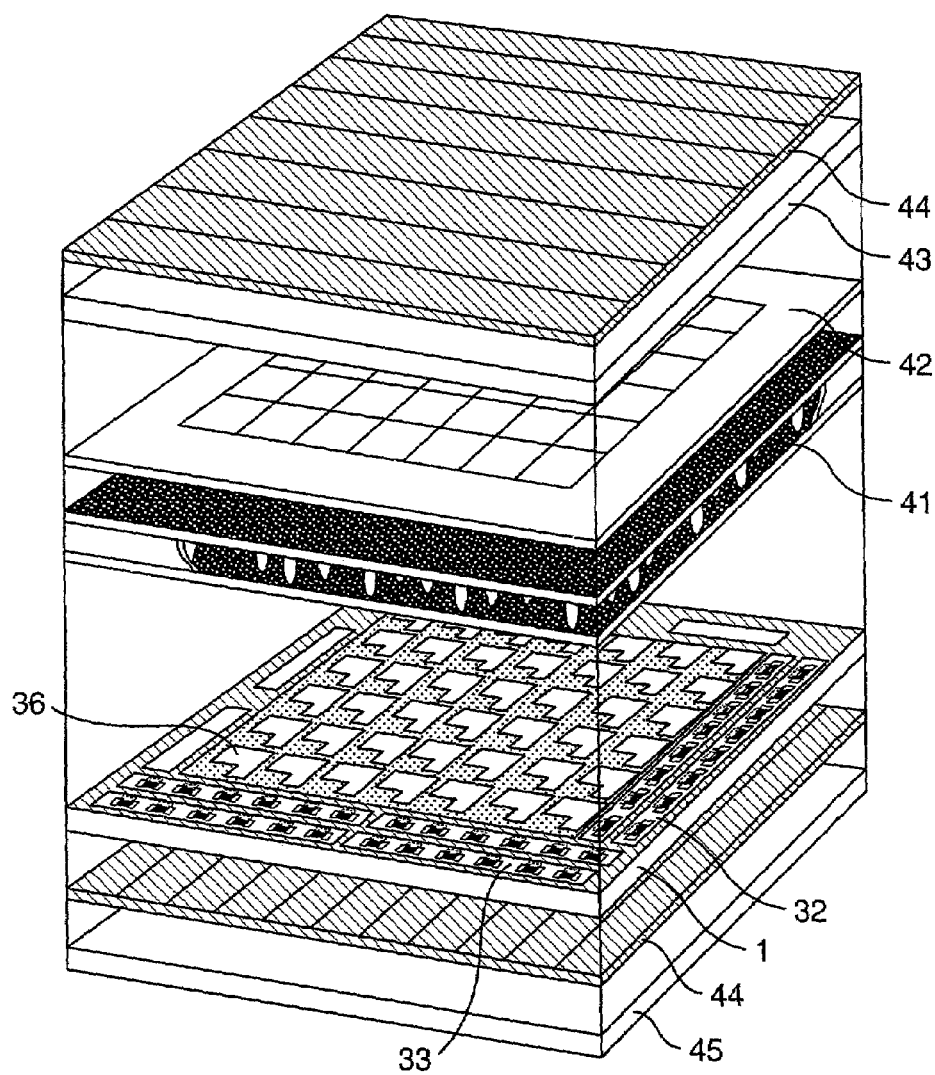
FIG. 11 shows an image display device according to an eleventh embodiment of the present invention.

FIG. 11 shows an image display device that uses the thin film semiconductor devices according to the present invention. A liquid crystal layer 41, a common electrode 42, and a protective film 43 are superimposed on the insulating substrate 1 having the regions 32 and 33 and the pixels 36 in the tenth embodiment, one after another. These are sandwiched by upper and lower polarizing plates 44. By integrally forming these plates, film, electrode, layer, and substrate on a light-guiding plate 45, an image display panel is constituted.

Twelfth Embodiment

Figure 12:
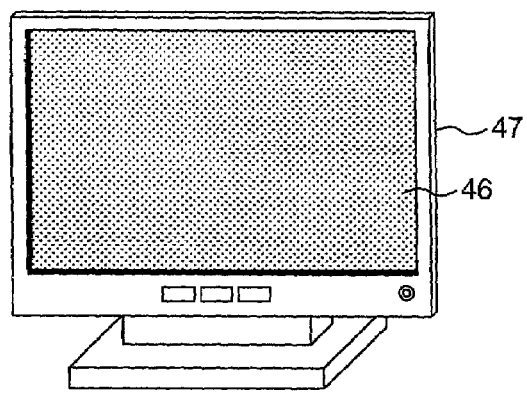
FIG. 12 shows an external view of a computer monitor or a television device according to a twelfth embodiment of the present invention.

FIG. 12 shows an external view of a computer monitor or a television device 47 that includes an image display panel 46 according to the eleventh embodiment of the present invention.

Thirteenth Embodiment

Figure 13:
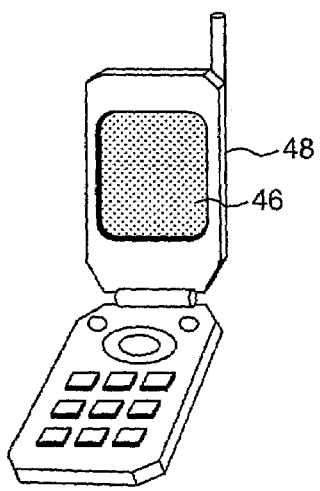
FIG. 13 shows an external view of a cell phone according to a thirteenth embodiment of the present invention.

FIG. 13 shows an external view of a cell phone 48 that includes the image display panel 46 according to the eleventh embodiment of the present invention.

Fourteenth Embodiment

Figure 14:
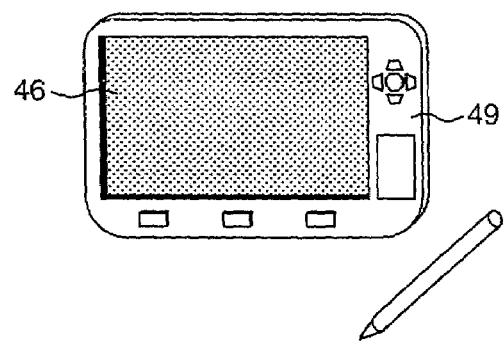
FIG. 14 shows an external view of a mobile terminal according to a fourteenth embodiment of the present invention.

FIG. 14 shows an external view of a mobile terminal 49 that includes the image display panel 46 according to the eleventh embodiment of the present invention.

Fifteenth Embodiment

Figure 15:
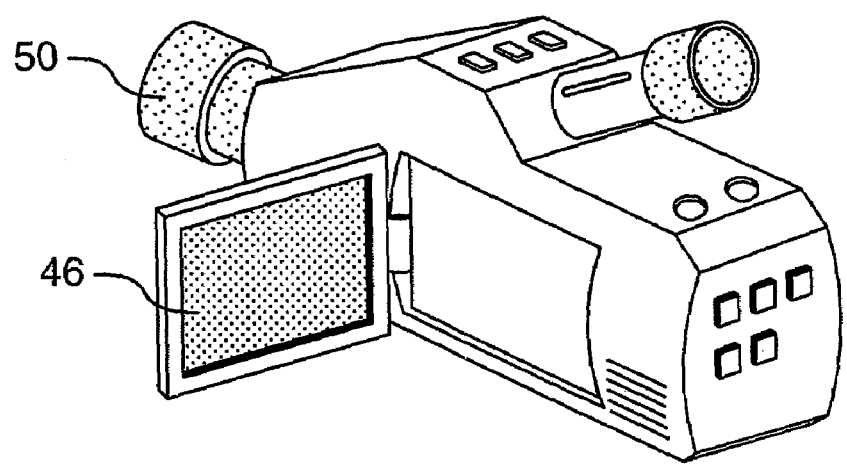
FIG. 15 shows an external view of a digital video recorder according to a fifteenth embodiment of the present invention.

FIG. 15 shows an external view of a digital video recorder 50 that includes the image display panel 46 according to the eleventh embodiment of the present invention.

Sixteenth Embodiment

Figure 16:
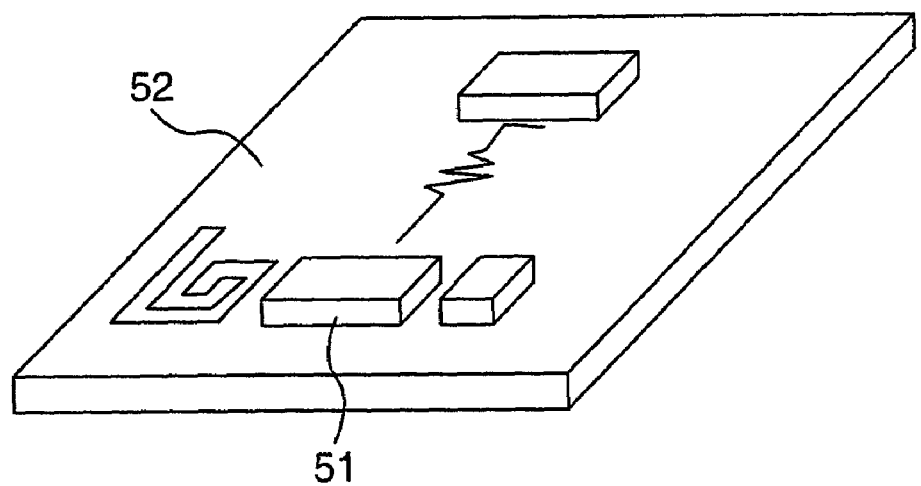
FIG. 16 shows an external view of an RF device according to a sixteenth embodiment of the present invention.

FIG. 16 shows an external view of a circuit unit 51 and an RF device 52 in a case where the circuit unit in the ninth embodiment has been applied to a control unit of the radio-frequency (RF) device.

In accordance with the disclosure of the embodiment of this invention, a rectangular grain crystal with a large grain and small surface, with concave and convex portions, can form a channel. By such a structure of this invention, a thin film transistor with a high mobility and a high gate blocking voltage is realizable. Accordingly, a pixel portion and peripheral circuits are intensively formed on a same glass substrate; therefore, a thin film semiconductor apparatus of sophisticated function and image displaying apparatus can be realized.

It should be further understood by those skilled in the art that although the foregoing description has been made with respect to a number of disclosed example embodiments of the invention, the invention is not to be construed as being limited thereto and, therefore, various changes and modifications may be made without departing from the spirit of the invention and the scope of the appended claims.

What we claim is:

1. A thin film semiconductor device comprising an insulating substrate, a Si thin film formed over the insulating substrate, and a transistor with the Si thin film as a channel thereof, wherein:
   the Si thin film comprises a polycrystal where a plurality of narrow, rectangular crystal grains are arranged, being spaced apart from each other;
   the Si thin film is not present between the rectangular crystal grains; and
   surface of the rectangular crystal grains are flat in one direction and convex in a direction perpendicular to said one direction.

2. The thin film semiconductor device according to claim 1, wherein a contact angle between one of the rectangular crystal grains and the substrate, which is an angle between a line normal to an edge surface of said one of the rectangular crystal grains and a line normal to the substrate ranges from 10 to 60°.

3. An image display device including a thin film semiconductor device comprising an insulating substrate, a Si thin film formed over the insulating substrate, and a transistor with the Si thin film as a channel thereof, wherein:
   the Si thin film comprises a polycrystal where a plurality of narrow, rectangular crystal grains are arranged, being spaced apart to each other;

the Si thin film is not present between the rectangular crystal grains; and surfaces of the rectangular crystal grains are flat in one direction and convex in a direction perpendicular to said one direction.

4. An image display device including the thin film semiconductor device according to claim 3, wherein a contact angle between one of the rectangular crystal grains and the substrate, which is an angle between a line normal to an edge surface of said one of the rectangular crystal grains and a line normal to the substrate ranges from 10 to 60 degrees.

* * * * *